United States Patent
Querbach et al.

(10) Patent No.: US 7,228,515 B2
(45) Date of Patent: Jun. 5, 2007

(54) METHODS AND APPARATUSES FOR VALIDATING AC I/O LOOPBACK TESTS USING DELAY MODELING IN RTL SIMULATION

(75) Inventors: Bruce Querbach, Orangevale, CA (US); Amjad Khan, Folsom, CA (US); Mike Tripp, Forest Grove, OR (US); Luis Briceno Guerrero, San Jose (CR); Marco A. Vindas Vargas, San Jose (CR); Ali Muhtaroglu, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 296 days.

(21) Appl. No.: 10/846,721

(22) Filed: May 13, 2004

(65) Prior Publication Data

US 2005/0257185 A1    Nov. 17, 2005

(51) Int. Cl.
G06F 9/45     (2006.01)
G06F 17/50    (2006.01)

(52) U.S. Cl. ............... 716/6; 716/4; 716/5; 716/18
(58) Field of Classification Search ............ 716/4–6, 716/10, 1, 18; 703/13–19
See application file for complete search history.

(56) References Cited

U.S. PATENT DOCUMENTS

| | | | |
|---|---|---|---|
| 6,239,635 B1 * | 5/2001 | Matsuzaki | 327/160 |
| 6,360,353 B1 * | 3/2002 | Pember et al. | 716/4 |
| 6,477,674 B1 * | 11/2002 | Bates et al. | 714/738 |
| 6,980,945 B2 * | 12/2005 | Elias | 703/17 |
| 6,983,432 B2 * | 1/2006 | Hayes | 716/4 |
| 6,986,113 B2 * | 1/2006 | Sinha et al. | 716/4 |
| 6,996,513 B2 * | 2/2006 | Bellam | 703/14 |
| 2002/0049576 A1 * | 4/2002 | Meyer | 703/14 |

OTHER PUBLICATIONS

Dumlugol et al., Analog Modeling Using Event-Driven HDL's, Jan. 1994, IEEE, pp. 53-56.*
Li et al., Optimization of Analog Modeling and Simulation, 1998, IEEE, pp. 385-388.*
Walker et al., On the Nature and Indequavies of Transport TIming Delay Constructs in VHDL Description, Aug. 1997, IEEE, vol. 16, No. 8, pp. 894-915.*
Provost et al., AC IO Loopback Design for High Speed Uprocessor IO test, Feb. 2004, IEEE, pp. 23-30.*
Akita et al., A Novel Analog Mirror Type DLL suitable for Low Voltage Operation with Self-Calibration Method, 2000, IEEE, pp. 343-344.*

* cited by examiner

Primary Examiner—Paul Dinh
Assistant Examiner—Nghia M. Doan
(74) Attorney, Agent, or Firm—Blakely, Sokoloff, Taylor & Zafman LLP

(57) ABSTRACT

Embodiments of the invention provide a logic simulation having a controllable delay model implemented therein that may be used to validate AC I/O loopback design in a pre-silicon environment by introducing delay models that allow the logic simulators to simulate analog behavior. For one embodiment of the invention, a fixed processor ratio is selected and delay statements of the hardware description language correspond to a specific time delay. These fixed values provide the ability to accurately determine and adjust delay in an analog simulation.

18 Claims, 3 Drawing Sheets

```
wire ACIOBUSFreq = 3'd200;
reg    clock_out;
always @ (ACIOBUSFreq or clock)
casex (ACIOBUSFreq)
    3'd100 = clock_out <= #313 clock;
    3'd133 = clock_out <= #234 clock;
    3'd167 = clock_out <= #188 clock;
    3'd200 = clock_out <= #156 clock;
    3'd267 = clock_out <= #117 clock;  //BQ: default ext bus freq
    default = clock_out <= #100 clock;
endcase  casex (ACIOBUSFreq)

always @ (clock_out) clock <= clock_out;

assign system .csimclk = clock;
```

FIG. 3

METHODS AND APPARATUSES FOR VALIDATING AC I/O LOOPBACK TESTS USING DELAY MODELING IN RTL SIMULATION

FIELD

Embodiments of the invention relate generally to the field of integrated circuit components, and more specifically to testing AC timing specifications of input/output circuits of an integrated circuit component.

BACKGROUND

Integrated circuit (IC) components are typically tested prior to use in a system. Such tests seek to verify proper functionality within each input/output (I/O) buffer of the integrated circuit component (e.g., processor, main memory device). The need for testing extends, likewise, to the system or platform of which the IC component is a part.

It is very costly to implement a logic design and subsequently detect errors in that design. It would be beneficial to detect errors in the logic design and effect design changes prior to implementation of the design (i.e., prior to silicon fabrication).

Typical pre-silicon validation of the logic design has two phases, the logic-level simulation and the analog simulation. The logic-level simulation is usually a 2-stage or 4-stage discrete simulation, which employs a number of AND gates, flops, etc., with binary results. The analog simulation, which models capacitors, resistors, gates, etc., is not binary, but provides a measurable slope. The problem with typical pre-silicon analog simulation is that it is limited in scope.

One type of analog simulation is AC I/O loopback simulation, which may be accomplished, post-silicon, using built-in self-test (BIST) circuitry implemented within each IC component, to verify, at speed, inter-component communications in the system. For example, an AC I/O loopback test may be effected by driving test data out of the IC component through an output portion of an I/O buffer. The data is then driven back through an input portion of the I/O buffer. The actual received (or driven) test values are then compared with corresponding expected values to verify proper functionality and timing of the input and output portion of each I/O buffer associated with each pin of the IC component. This allows a self-test of the I/O circuitry that is independent of the core logic of the IC component.

In a typical such system, the I/O buffer includes an I/O pad, an output driver, an input receiver, and a test circuit that generates test pattern signals when the I/O buffer is operating in a test mode. A latch is used to store an error signal that is generated as part of the test. The latch may be a boundary scan latch, the contents of which may be examined by other IC components of the system, or by an external testing apparatus, as part of a boundary scan-chain where test values from multiple IC components are shifted out serially. Using such a technique, test pattern values may be loaded into the latch one bit at a time, through a serial scan-in port, and read out of the latch serially through a scan-out port.

Such BIST circuitry may be implemented within various types of IC components including the processor, buffers, memory controller hub, I/O hub, etc., and may allow for testing of interconnects (e.g., buses) between components including the interface between boards.

The AC I/O loopback simulation is quite complex and provides a great deal of details regarding the IC component. This complexity is also the source of a disadvantage in that, due to its complexity, AC I/O loopback simulation can only be effected on a limited scope. The simulation can be effected for only a portion of the processor chip (e.g., several gates, a small circuit) at a time. That is, although it offers such benefits as accurate timing, RC effects, and slope information, prior art dynamic circuit simulation is limited by device count. Trying to include too many circuits in a dynamic simulation would increase simulation time to an unmanageable scale. So, though each component piece of the logic can be addressed, the combination, spanning the entire processor chip, is immense and contains too many pieces of logic (e.g., gates) to be accurately addressed by analog circuit simulation. Moreover, some portions of the system design, for systems of typical complexity, cannot be validated through analog circuit simulation due to the scope of the system.

BRIEF DESCRIPTION OF THE DRAWINGS

The invention may be best understood by referring to the following description and accompanying drawings that are used to illustrate embodiments of the invention. In the drawings:

FIG. 3 illustrates exemplary logic code that can be inserted into the simulation model to effect a delay model for analog simulation in accordance with one embodiment of the invention.

DETAILED DESCRIPTION

In the following description, numerous specific details are set forth. However, it is understood that embodiments of the invention may be practiced without these specific details. In other instances, well-known circuits, structures and techniques have not been shown in detail in order not to obscure the understanding of this description.

Reference throughout the specification to "one embodiment" or "an embodiment" means that a particular feature, structure, or characteristic described in connection with the embodiment is included in at least one embodiment of the present invention. Thus, the appearance of the phrases "in one embodiment" or "in an embodiment" in various places throughout the specification are not necessarily all referring to the same embodiment. Furthermore, the particular features, structures, or characteristics may be combined in any suitable manner in one or more embodiments.

Moreover, inventive aspects lie in less than all features of a single disclosed embodiment. Thus, the claims following the Detailed Description are hereby expressly incorporated into this Detailed Description, with each claim standing on its own as a separate embodiment of this invention.

Figure 1A:
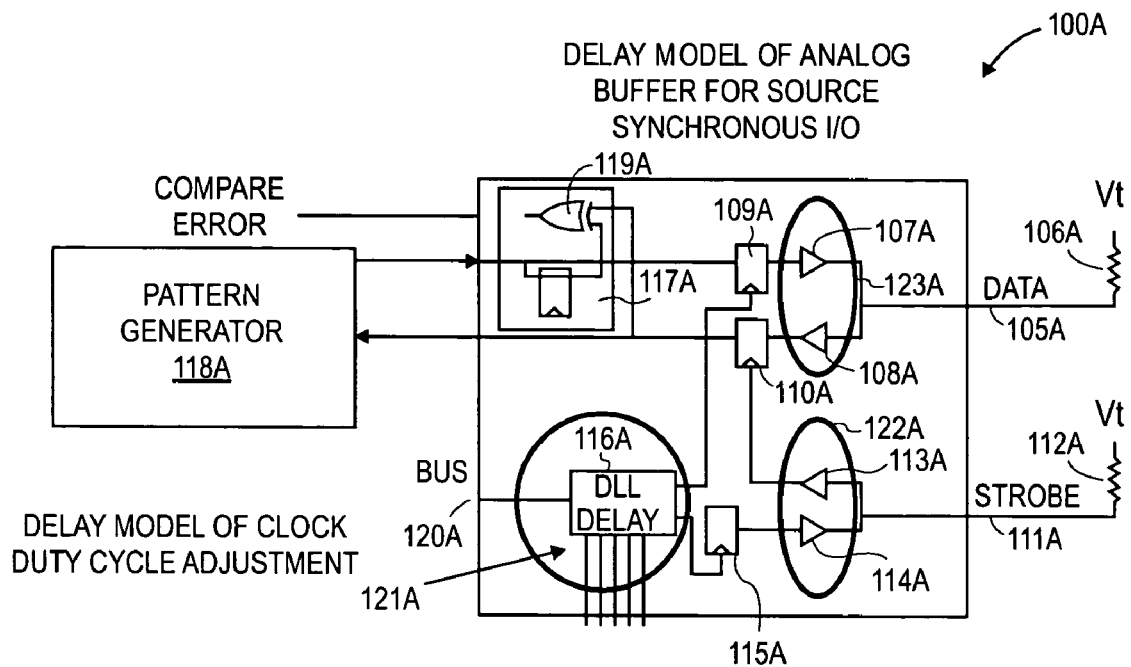
FIG. 1A illustrates a system for modeling the analog buffer delay and the clock duty cycle adjustment circuits for a source synchronous I/O using delay models in a logic simulation in accordance with one embodiment of the invention.

FIG. 1A illustrates a system for modeling the analog buffer delay and the clock duty cycle adjustment circuits for a source synchronous I/O using delay models in a logic simulation in accordance with one embodiment of the invention.

System 100A, shown in FIG. 1A, is part of a BIST cell that is designed for source synchronous operation. As shown in FIG. 1A, data 105A from an external pin (not shown) is connected through resistor 106A to $V_t$. The data 105A is input to an outbound data buffer 107A and an inbound data buffer 108A, which are connected latches 109A and 110A, respectively. The strobe 111A, likewise, is connected to $V_t$, via resistor 112A, and is input to an inbound strobe buffer 113A and an outbound strobe buffer 114A. The inbound strobe buffer 113A is connected to the latch 110A of the inbound data buffer 108A (i.e., latch 110A is clocked by the strobe 111A). The outbound strobe buffer 114A is connected to latch 115A. Latches 115A and 109A are clocked by a transmit clock signal provided by a delay locked loop (DLL) circuit 116A. The DLL delay is used in the AC I/O loopback simulation to stress the AC timing. That is, by shifting the strobe (e.g., left or right in the timing diagram), it is possible to determine points in the timing diagram where the strobe will cause a failure (i.e., erroneous data is latched). Such points establish a valid timing window such that any part in silicon that performs within the valid timing window is considered good.

When stressing the AC timing, a failure condition is detected by comparison logic 117A, which compares test values obtained from the pattern generator 118A to a looped back version of the test values using the EXCLUSIVE OR gate 119A. The looped back version of the test value is captured by a latch 110A clocked by a looped back strobe signal generated by the DLL circuit 116A. The margin of operation may be determined by, as mentioned above, advancing or delaying this strobe signal via the DLL circuit 116A to continue to stress the driver until a failure occurs. Upon the occurrence of a failure condition, as indicated by the EXCLUSIVE OR gate 119A, an error register (not shown) is used to capture the DLL setting for the strobe signal. Multiple failure settings may be captured, including the examples given above for "first fail" and "all fail". The error registers may then be read, for example via scan chain commands sent to the IC component via a test access port (TAP).

In the source synchronous I/O of FIG. 1A, the bus clock 120A is considered a stable clock (i.e., a reference clock) that is shifted by the DLL delay.

As shown in FIG. 1A, three areas of the cell, the DLL clock delay 121A, the strobe buffers 122A, and the data buffers 123A, that have analog behavior, are selected for delay modeling in accordance with one embodiment of the invention.

Figure 1B:
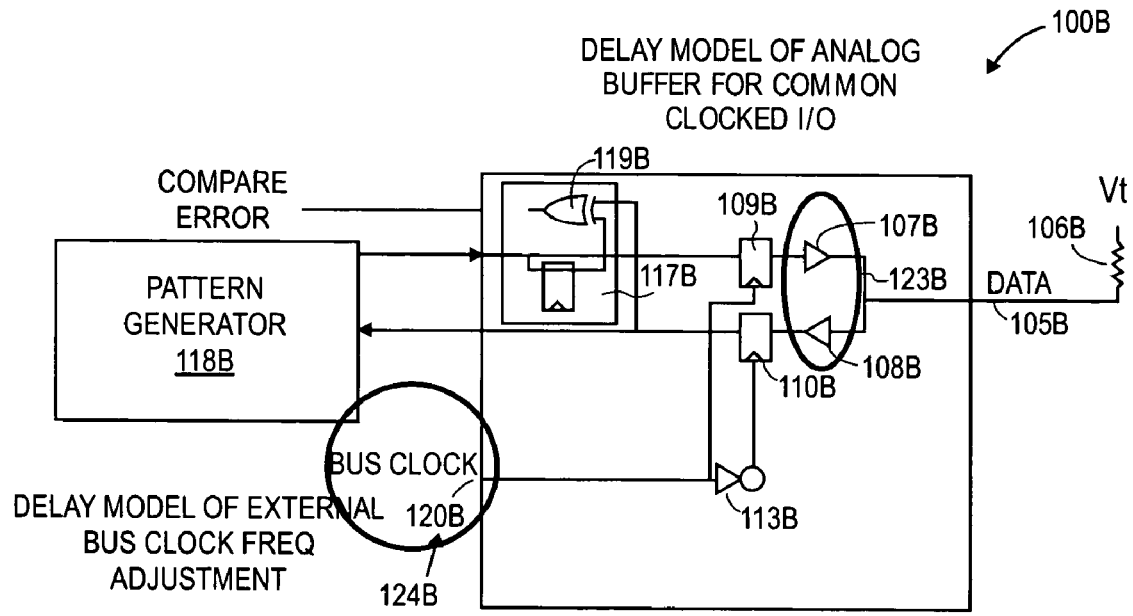
FIG. 1B illustrates a system for modeling the analog buffer delay and the clock duty cycle adjustment circuits for a common clocked I/O using delay models in a logic simulation in accordance with one embodiment of the invention.

FIG. 1B illustrates a system for modeling the analog buffer delay and the clock duty cycle adjustment circuits for a common clocked I/O using delay models in a logic simulation in accordance with one embodiment of the invention.

As shown in FIG. 1B, data 105B from an external pin (not shown) is connected through resistor 106B to $V_t$. The data 105B is input to an outbound data buffer 107B and an inbound data buffer 108B, which are connected to latches 109B and 110B, respectively. Latch 109B is clocked by bus clock 120B and latch 110B is clocked by bus clock 120B through buffer 113B. When stressing the AC timing, a failure condition is detected by comparison logic 117B, which compares test values obtained from the pattern generator 118B to a looped back version of the test values using the EXCLUSIVE OR gate 119B. The looped back version of the test value is captured by a latch 110B.

A common clocked I/O buffer does not include a strobe and therefore only has two areas that have analog behavior, therefore, as shown in FIG. 1B, only two areas of the cell, the bus clock 124B, and the data buffers 123B, are selected for delay modeling in accordance with one embodiment of the invention.

Figure 2:
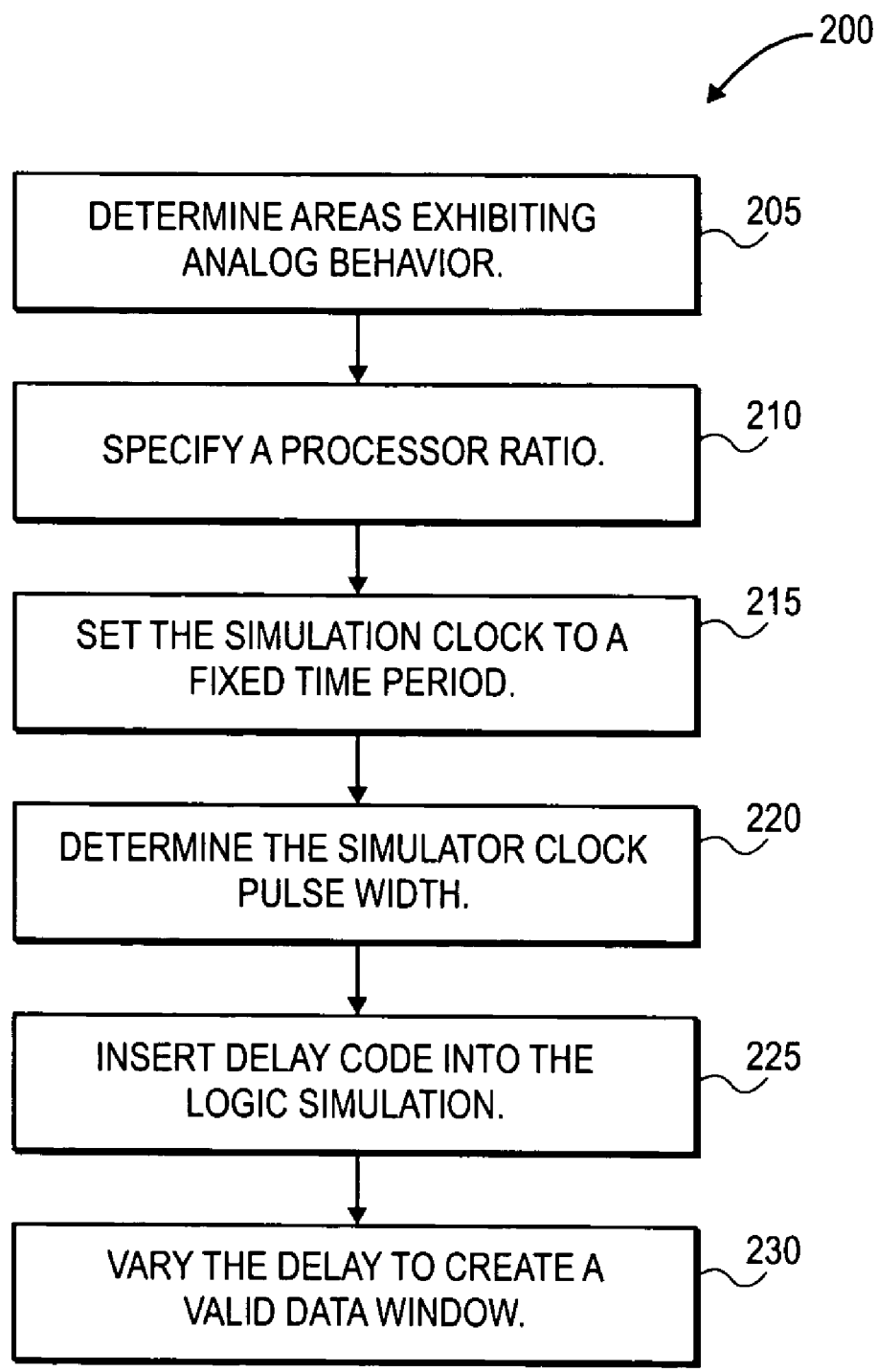
FIG. 2 illustrates a process for modeling analog behavior using a logic simulation in accordance with one embodiment of the invention.

FIG. 2 illustrates a process for modeling analog behavior using a logic simulation in accordance with one embodiment of the invention. Process 200, shown in FIG. 2, begins at operation 205 in which areas of an analog simulation exhibiting analog behavior are determined. For example, as described above in reference to FIG. 1A, the analog areas that have analog behavior are the DLL clock delay, the strobe buffers, and the data buffers.

At operation 210, the ratio of the processor speed to the bus speed (processor ratio) is specified. A significant distinction between silicon and RTL simulation is that, in silicon, the bus clock (bclk) is fixed by the motherboard, the internal processor ratio is set through a fuse, and the frequency of the master clock (mclk) varies depending on the processor ratio. In contrast, in RTL simulation, the computer simulation and integration master (csim) clock is fixed, thus the mclk is fixed, and the frequency of the bclk varies depending on the processor ratio. This complication in RTL simulation is avoided by specifying a processor ratio (e.g., 16:1). For one embodiment of the invention, the processor ratio is specified as 16:1. In alternative embodiments, the processor ratio could be higher (e.g., 64:1) or lower (1:1). For one embodiment of the invention, the processor ratio is specified based upon the speed at which the particular silicon will run the simulation.

After the processor ratio is specified (fixed), the delay model calculations can be completed. At operation 215, the csim clock delay is set to a fixed time period. For example, assuming a loop delay of 1.2 ns, a Verilog instruction "# delay=1200" can be used such that every # delay of the csim clock equals 1 ps. This is in contrast to prior art systems, in which the csim clock has no correlation with any on-chip or off-chip clock. For one embodiment of the invention, each Verilog # delay is equal to 1 ps. For alternative embodiments of the invention, the corresponding time for each Verilog # delay may be specified as something other than 1 ps based upon the system simulation.

At operation 220, the csim clock pulse width is determined based upon the bclk. Table 1 illustrates csim clock pulse width for each of a number of bclk speeds for a specified processor ratio of 16:1.

TABLE 1

| BCLK (MHz) | Mclk (MHz) | Time (ps) | Pulse (ps) |
| --- | --- | --- | --- |
| 100 | 1,600 | 625 | 313 |
| 133 | 2,133 | 469 | 234 |
| 167 | 2,667 | 375 | 188 |
| 200 | 3,200 | 313 | 156 |
| 267 | 4,267 | 234 | 117 |
| 333 | 5,333 | 188 | 94 |
| 400 | 6,400 | 156 | 78 |
| 533 | 8,533 | 117 | 59 |

As shown in Table 1, the bclk speed (e.g., 100 MHz) and the processor ratio (e.g., 16:1) yield a mclk speed of 1,600 MHz corresponding to a clock period of 625 ps and a clock pulse of 313 ps duration. So, if a cycle time of 313 ps is used for a csim clock or an mclk, each verilog # delay corresponds to 1 ps. Table 1 is constructed to ensure that the verilog # delay has a one-to-one correspondence to picoseconds. Now, because the csim clock delay is set to a fixed time period (e.g., 313 ps pulse width), and because each one ps delay of the csim clock is equal to, for example, one # delay, the simulation environment can be encoded with the appropriate delay model for validation. This allows implementation of a desired delay model using verilog # delay statements.

For one embodiment, the information of Table 1 is coded as an MUX that can be forced during an RTL validation test to switch to different bus frequencies.

FIG. 3 illustrates exemplary logic code that can be inserted into the simulation model to effect a delay model for analog simulation in accordance with one embodiment of the invention. Logic code 300, shown in FIG. 3, relates a number of bclk speeds 305 to corresponding pulse widths 310.

Table 2 illustrates verilog # statements that can be added to effect coarse delay and fine delay in clock duty cycle adjustments based upon the exemplary logic code of FIG. 3. As shown in Table 2, the csim clk is set such that every verilog # delay equals 1 ps.

TABLE 2

| Delay (ps) | Verilog Statement |
|---|---|
| Grid delay (20) | # 20 |
| Fine delay (40) | # 40 |
| Coarse delay (120) | # 120 |

Referring again to FIG. 2, at operation 225, the delay code is inserted into the logic simulation. This provides the known delay to enable validation of the analog simulation. So, for example, the delay code representing DLL clock delay 121A of FIG. 1A will have a #120, corresponding to 120 ps. That is, the Verilog # delay statement (e.g., #120) corresponds to an actual and specific delay time (e.g., 120 ps).

At operation 230, the delay is varied to create a valid data window. That is, the delay is varied and data pass or data fail is determined for each specific delay. The individual delays, for which the data passes, comprise a valid data window, which can be compared to a design specification to verify proper functionality of the system. For one embodiment, the delay is incrementally varied through a plurality of delay values. For each of the delay values, a pass/fail result is determined. The pass/fail results are then used to create a valid data window or data eye.

General Matters

Embodiments of the invention may be used to validate AC I/O loopback design in a pre-silicon environment by introducing delay models that allow the logic simulators to simulate analog behavior. For one embodiment of the invention, the delay model can be implemented using hardware description language (e.g., Verilog) delay statements (# delay statements), by adjusting the csim clock based upon the real bus frequency.

Various embodiments of the invention have been described in the context of AC I/O simulation, however alternative embodiments of the invention are applicable to other analog simulations in a logic situation.

Embodiments of the invention include methods having various operations, many of which are described in their most basic form, but operations can be added to or deleted from any of the methods without departing from the basic scope of the invention. The operations of various embodiments of the invention may be performed by hardware components or may be embodied in machine-executable instructions as described above. Alternatively, the operations may be performed by a combination of hardware and software. Embodiments of the invention may be provided as a computer program product that may include a machine-accessible medium having stored thereon instructions, which may be used to program a computer (or other electronic devices) to perform a process according to embodiments of the invention as described above.

A machine-accessible medium includes any mechanism that provides (i.e., stores and/or transmits) information in a form accessible by a machine (e.g., a computer, network device, personal digital assistant, manufacturing tool, any device with a set of one or more processors, etc.). For example, a machine-accessible medium includes recordable/non-recordable media (e.g., read only memory (ROM); random access memory (RAM); magnetic disk storage media; optical storage media; flash memory devices; etc.), as well as electrical, optical, acoustical or other form of propagated signals (e.g., carrier waves, infrared signals, digital signals, etc.); etc.

While the invention has been described in terms of several embodiments, those skilled in the art will recognize that the invention is not limited to the embodiments described, but can be practiced with modification and alteration within the spirit and scope of the appended claims. The description is thus to be regarded as illustrative instead of limiting.

What is claimed is:

1. A method comprising:
    determining areas of a simulated circuit that exhibit analog behavior, the analog behavior corresponding to an expected delay;
    setting a delay instruction of a hardware description language to correspond to a specified time period by setting a processor ratio to a fixed value, the processor ratio corresponding to ratio of a simulated circuit internal speed to a simulated circuit bus speed, and specifying the time period using the ratio:
    setting a simulation clock pulse width based upon the specified time period;
    inserting delay code corresponding to an actual delay, the delay code based upon the simulation clock pulse width, and the actual delay based upon the expected delay;
    testing the analog areas using the inserted delay code; and
    creating a valid data window based upon the testing.

2. The method of claim 1 wherein the processor ratio is set to 16 to 1.

3. The method of claim 1 wherein the specified time period is 1 picosecond.

4. The method of claim 1 wherein testing further comprises:
    changing the delay code to incrementally vary the actual delay through a plurality of delay values; and
    determining pass/fail results for the circuit for each of the plurality of delay values; and
    wherein creating a valid data window comprises creating the valid data window based upon the pass/fail results.

5. The method of claim 1 wherein the hardware description language is Verilog and the delay instruction is a "# delay" instruction.

6. The method of claim 1 wherein the circuit is simulated using a logic simulation.

7. An article of manufacture comprising:
a machine-accessible medium having associated data, wherein the data, when accessed, results in a machine performing operations comprising:
simulating a circuit;
determining areas of the circuit that exhibit analog behavior, the analog behavior corresponding to an expected delay;
setting a delay instruction of a hardware description language to correspond to a specified time period by setting a processor ratio to a fixed value, the processor ratio corresponding to a ratio of a simulated circuit internal speed to a simulated circuit bus speed, and specifying the time period using the ratio;
setting a simulation clock pulse width based upon the specified time period;
inserting delay code corresponding to an actual delay, the delay code based upon the simulation clock pulse width, and the actual delay based upon the expected delay;
testing the analog areas using the inserted delay code; and
creating a valid data window based upon the testing.

8. The article of manufacture of claim 7, wherein testing further comprises:
changing the delay code to incrementally vary the actual delay through a plurality of delay values; and
determining pass/fail results for the circuit for each of the plurality of delay values; and
wherein creating a valid data window comprises creating the valid data window based upon the pass/fail results.

9. The article of manufacture of claim 8 wherein the processor ratio is set to 16 to 1.

10. The article of manufacture of claim 7 wherein the specified time period is one picosecond.

11. The article of manufacture of claim 7 wherein the hardware description language is Verilog and the delay instruction is a "# delay" instruction.

12. The article of manufacture of claim 7 wherein the circuit is simulated using a logic simulation.

13. A system comprising:
a processor; and
a memory coupled to the processor, the memory storing instructions which, when executed by the processor cause the processor to simulate a circuit having analog portions, the analog portions resulting in an expected delay wherein simulating the circuit includes setting a delay instruction of a hardware description language to correspond to a specified time period by setting a processor ratio to a fixed value, the processor ratio corresponding to a ratio of a simulated circuit internal speed to a simulated circuit bus speed, and specifying the time period using the ratio, setting a simulation clock pulse width based upon the specified time period, inserting delay code corresponding to an actual delay, the delay code based upon the simulation clock pulse width, and the actual delay based upon the expected delay, testing the analog areas using the inserted delay code, and creating a valid data window.

14. The system of claim 13, wherein the memory stores further instructions for testing which, when executed by the processor cause the processor to further change the delay code to incrementally vary the actual delay through a plurality of delay values, determine pass/fail results for the circuit for each of the plurality of delay values, and creating the valid data window based upon the pass/fail results.

15. The system of claim 14 wherein the processor ratio is set to 16 to 1.

16. The system of claim 13 wherein the specified time period is one picosecond.

17. The system of claim 13 wherein the hardware description language is Verilog and the delay instruction is a "# delay" instruction.

18. The system of claim 13 wherein the circuit is simulated using a logic simulation.

* * * * *

UNITED STATES PATENT AND TRADEMARK OFFICE
CERTIFICATE OF CORRECTION

| | |
|---|---|
| PATENT NO. | : 7,228,515 B2 |
| APPLICATION NO. | : 10/846721 |
| DATED | : June 5, 2007 |
| INVENTOR(S) | : Querbach et al. |

Page 1 of 1

It is certified that error appears in the above-identified patent and that said Letters Patent is hereby corrected as shown below:

In column 6, at line 40, after "to" insert --a--.

In column 8, at line 33, delete "#" and insert --"#--.

Signed and Sealed this

Eighth Day of April, 2008

JON W. DUDAS
*Director of the United States Patent and Trademark Office*